United States Patent
Lee et al.

(10) Patent No.: US 11,567,408 B2
(45) Date of Patent: Jan. 31, 2023

(54) COATING COMPOSITION FOR USE WITH AN OVERCOATED PHOTORESIST

(71) Applicants: ROHM AND HAAS ELECTRONIC MATERIALS KOREA LTD., Cheonan-si (KR); ROHM AND HAAS ELECTRONIC MATERIALS LLC, Marlborough, MA (US)

(72) Inventors: Hye-Won Lee, Cheonan-si (KR); Min Kyung Jang, Cheonan-si (KR); Soo Jung Leem, Cheonan-si (KR); Jae Hwan Sim, Cheonan-si (KR); Emad Aqad, Northborough, MA (US)

(73) Assignees: ROHM AND HAAS ELECTRONIC MATERIALS KOREA LTD., Cheonan-si (KR); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 664 days.

(21) Appl. No.: 16/653,659

(22) Filed: Oct. 15, 2019

(65) Prior Publication Data
US 2021/0109447 A1    Apr. 15, 2021

(51) Int. Cl.
| | | |
|---|---|---|
| *G03F 7/11* | (2006.01) | |
| *C08F 220/34* | (2006.01) | |
| *C09D 133/14* | (2006.01) | |
| *G03F 7/09* | (2006.01) | |
| *C09D 179/02* | (2006.01) | |
| *C09D 5/00* | (2006.01) | |
| *C08F 226/06* | (2006.01) | |
| *C09D 139/08* | (2006.01) | |
| *C08G 73/02* | (2006.01) | |

(52) U.S. Cl.
CPC .............. *G03F 7/11* (2013.01); *C08F 220/34* (2013.01); *C08F 226/06* (2013.01); *C08G 73/024* (2013.01); *C09D 5/006* (2013.01); *C09D 133/14* (2013.01); *C09D 139/08* (2013.01); *C09D 179/02* (2013.01); *G03F 7/091* (2013.01); *G03F 7/094* (2013.01)

(58) Field of Classification Search
CPC ........... G03F 7/091; G03F 7/11; C08G 59/40; C08G 73/0655; C08F 220/34
See application file for complete search history.

(56) References Cited

U.S. PATENT DOCUMENTS

| | | | |
|---|---|---|---|
| 5,948,847 A | 9/1999 | Iguchi et al. | |
| 8,722,841 B2 * | 5/2014 | Saito ....................... | C08L 79/02 528/270 |
| 9,029,078 B2 * | 5/2015 | Young ...................... | A61P 7/08 435/1.2 |
| 9,221,991 B2 * | 12/2015 | Fujii ...................... | C08F 265/04 |
| 9,263,285 B2 | 2/2016 | Shinjo et al. | |
| 9,263,286 B2 | 2/2016 | Sakamoto et al. | |
| 9,482,951 B2 | 11/2016 | Sullivan et al. | |
| 9,514,949 B2 | 12/2016 | Someya et al. | |
| 9,708,493 B2 * | 7/2017 | Amara .................... | C07C 69/94 |
| 10,527,942 B2 * | 1/2020 | Sim .......................... | G03F 7/30 |
| 10,656,522 B2 * | 5/2020 | Wang ....................... | G03F 7/11 |
| 11,199,777 B2 * | 12/2021 | Nishimaki ............ | G03F 7/2059 |
| 2007/0238052 A1 * | 10/2007 | Zampini ................. | G03F 7/162 430/311 |
| 2010/0009296 A1 | 1/2010 | Kon | |
| 2013/0122710 A1 | 5/2013 | Saito et al. | |
| 2014/0235060 A1 | 8/2014 | Shinjo et al. | |
| 2015/0044876 A1 | 2/2015 | Nishimaki et al. | |
| 2016/0147151 A1 | 5/2016 | Shinjo et al. | |
| 2016/0326396 A1 | 11/2016 | Nishimaki et al. | |
| 2016/0357110 A1 | 12/2016 | Zhou et al. | |
| 2017/0153547 A1 | 6/2017 | Sim et al. | |
| 2017/0283651 A1 | 10/2017 | Sim et al. | |
| 2018/0334588 A1 | 11/2018 | Kayaba et al. | |
| 2018/0364576 A1 | 12/2018 | Lee et al. | |
| 2019/0085173 A1 | 3/2019 | Lee et al. | |
| 2019/0204742 A1 * | 7/2019 | Lee ......................... | G03F 7/11 |
| 2020/0041905 A1 | 2/2020 | Tamura et al. | |
| 2020/0124965 A1 * | 4/2020 | Nishita ................... | G03F 7/091 |
| 2021/0324122 A1 * | 10/2021 | Lee .................... | C09D 133/068 |

FOREIGN PATENT DOCUMENTS

| | | | | |
|---|---|---|---|---|
| JP | 2015124292 B2 | 7/2015 | | |
| WO | WO-2015098594 A1 * | 7/2015 | ............. | C08G 12/08 |
| WO | WO-2018143359 A1 * | 8/2018 | ....... | C07C 273/1809 |

* cited by examiner

*Primary Examiner* — Amanda C. Walke
(74) *Attorney, Agent, or Firm* — Cantor Colburn LLP

(57) ABSTRACT

A method for forming a photoresist relief image including applying a layer of a coating composition on a substrate; and disposing a layer of a photoresist composition on the layer of the coating composition, wherein the coating composition comprises an amine-containing polymer comprising a hydrocarbon-substituted amino group and having nitrogen atoms in an amount from 3 to 47 weight percent, based on a total weight of the amine-containing polymer.

15 Claims, No Drawings

COATING COMPOSITION FOR USE WITH AN OVERCOATED PHOTORESIST

BACKGROUND

A photoresist is a photosensitive composition which is used to transfer an image to a substrate. A coating layer of the photoresist is formed on the substrate, and then exposed to actinic radiation through a photomask. The photomask has regions which are opaque and transparent to actinic radiation. When the photoresist coating layer is exposed to the actinic radiation, light-inducible chemical modification occurs on the photoresist coating layer, and a pattern of the photomask is transferred to the photoresist coating layer. Thereafter, the photoresist coating layer is developed to form a patterned image that may be selectively treated on a substrate.

Reflection of activating radiation used to expose a photoresist often poses limits on resolution of the image patterned in the photoresist layer. Reflection of radiation from the substrate/photoresist interface may produce spatial variations in the radiation intensity in the photoresist, resulting in non-uniform photoresist linewidth upon development. Radiation also may scatter from the substrate/photoresist interface into regions of the photoresist where exposure is non-intended, again resulting in linewidth variations.

One approach used to reduce the problem of reflected radiation has been the use of a radiation absorbing layer (antireflective composition layer) interposed between the substrate surface and the photoresist coating layer. See U.S. Pat. Nos. 8,338,078; 69,270,152; 5,677,112; 8,481,247; 8,012,670; 6,818,381; and 7,846,638; WO067329A1; and EP2000852.

Dry etching is often preferred for pattern transfer with a photoresist relief image. The plasma used however in a dry etch process may cause damage to thinner oxide and nitride layers, such as may be employed in DRAM, flash memory, logic device fabrication. Wet etching is often preferred over plasma etching because of damage in the integrity of materials like metal gates or gate oxides. The under-layer provides local protection to the underlying materials from the chemical etchants used during wet etching. Hence this protection provided by the under-layer must be kept intact during the wet etch process with increasing complexity due to the continuous shrinking of critical dimensions. Peel-off of under-layer patterns is observed commonly during prolonged wet etches or on sub-metals with poor adhesion properties.

Accordingly, there remains a continuing need for coating compositions that may provide properties such as gap-filling, planarization, adhesion to metal substrates, and wet chemical etch resistance in addition to functioning as a bottom anti-reflective coating (BARC).

SUMMARY

An embodiment provides a method for forming a photoresist relief image including applying a layer of a coating composition on a substrate; and disposing a layer of a photoresist composition on the layer of the coating composition, wherein the coating composition comprises an amine-containing polymer comprising a hydrocarbon-substituted amino group and having nitrogen atoms in an amount from 3 to 47 weight percent, based on a total weight of the amine-containing polymer.

Another embodiment provides a coating composition for use with an overcoated photoresist composition, the coating composition including an amine-containing polymer comprising a hydrocarbon-substituted amino group and having nitrogen atoms in an amount from 3 to 47 weight percent, based on a total weight of the amine-containing polymer.

Yet another embodiment provides a coated substrate, including a layer of the coating composition of claim 10 disposed on a substrate; and a layer of a photoresist composition disposed on the layer of the coating composition.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below to explain aspects of the present description. The terminology used herein is for the purpose of describing particular embodiments only and is not intended to be limiting.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described aspects of embodiments may be combined in any suitable manner in the various embodiments.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenylene group" refers to an alkenyl group having a valence of two; "cycloalkenyl group" refers to a non-aromatic cyclic divalent hydrocarbon group having at least three carbon atoms, with at least one carbon-carbon double bond; "alkynyl group" refers to a monovalent hydrocarbon group having at least one carbon-carbon triple bond; "aryl group" refers to a monovalent aromatic monocyclic or polycyclic ring system, and may include a group with an aromatic ring fused to at least one cycloalkyl or heterocycloalkyl ring; "arylene group" refers to an aryl group having a valence of two; "alkylaryl group" refers to an aryl group that has been substituted with an alkyl group; "arylalkyl group" refers to an alkyl group that has been substituted with an aryl group; "heterocycloalkyl group" refers to a cycloalkyl group having 1-3 heteroatoms as ring members instead of carbon; "heterocycloalkylene group" refers to a heterocycloalkyl group having a valence of two; "heteroaryl group" refers to an aromatic group having 1-4 heteroatoms as ring members instead of carbon; "aryloxy group" refers to "aryl-O—"; and "arylthio group" refers to "aryl-S—". The prefix "hetero" means that the compound or group includes at least one member that is a heteroatom (e.g., 1, 2, or 3 heteroatom(s)) instead of a carbon atom, wherein the heteroatom(s) is each independently N, O, S, Si, or P. The prefix "halo" means a group including one more of a fluoro, chloro, bromo, or iodo substituent instead of a hydrogen atom. A combination of halo groups (e.g., bromo and fluoro), or only fluoro groups may be present. The term "(meth)acrylate" is inclusive of both methacrylate and acrylate, the term "(meth)allyl" is inclusive of both methallyl and allyl, and the term "(meth)acrylamide" is inclusive of both methacrylamide and acrylamide.

"Substituted" means that at least one hydrogen atom on the group is replaced with another group, provided that the designated atom's normal valence is not exceeded. When the substituent is oxo (i.e., =O), then two hydrogens on the atom are replaced. Combinations of substituents or variables are permissible. Exemplary groups that may be present on a "substituted" position include, but are not limited to, nitro (—$NO_2$), cyano (—CN), hydroxy (—OH), oxo (=O), amino (—$NH_2$), mono- or di-($C_{1-6}$)alkylamino, alkanoyl (such as a $C_{2-6}$ alkanoyl group such as acyl), formyl (—C(=O)H), carboxylic acid or an alkali metal or ammonium salt thereof, $C_{2-6}$ alkyl ester (—C(=O)O-alkyl or —OC(=O)-alkyl), $C_{7-13}$ aryl ester (—C(=O)O-aryl or —OC(=O)-aryl), amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—). When a group is substituted, the indicated number of carbon atoms is the total number of carbon atoms in the group, excluding those of any substituents. For example, the group —$CH_2CH_2$CN is a $C_2$ alkyl group substituted with a cyano group.

As noted above, under-layer patterns are exposed to chemical etchants during wet etching processes. The layers coating the underlying substrate are therefore susceptible to peel-off during prolonged wet-etches. The present inventors have found that coating compositions including amine-containing polymers achieve excellent adhesion to substrates, in particular metal substrates, as compared to other heteroatom-substituted polymer systems. More specifically, the nitrogen atoms of the amine-containing polymers in the coating compositions have improved adhesion with metal substrates comprising softer metals such as manganese, iron, nickel, copper, zinc, palladium, silver, cadmium, tungsten, tantalum, platinum, mercury, or the like.

Accordingly, an embodiment provides a method for forming a photoresist relief image, including applying a layer of a coating composition on a substrate and disposing a layer of a photoresist composition on the layer of the coating composition.

The coating composition includes the amine-containing polymer comprising a hydrocarbon-substituted amino group and having nitrogen atoms in an amount from 3 to 47 weight percent (wt %), based on a total weight of the amine-containing polymer. For example, the amine-containing polymer may include nitrogen atoms in an amount from 3 to 40 wt %, preferably 5 to 40 wt %, more preferably 10 to 40 wt %, even more preferably 15 to 40 wt %, still more preferably 20 to 40 wt % or 25 to 40 wt %, based on the total weight of the amine-containing polymer. The term "the total weight of the amine-containing polymer" refers to the weight average molecular weight of the amine-containing polymer.

As used herein, "amine-containing polymer comprising a hydrocarbon-substituted amino group" refers to a polymer having at least one structural repeating unit that includes a hydrocarbon-substituted amino group. As used herein, "a hydrocarbon-substituted amino group" is a group having at least one carbon-nitrogen bond. Preferred amino groups include primary amines, secondary amines, tertiary amines, and aliphatic heterocyclic or heteroaromatic amines containing one or more nitrogen atoms as ring members such as piperidines, pyrrolidines, pyrroles, pyridines, imidazoles, pyrimidines, pyrizines, indoles, quinolines, iosquionolones, purines, azepines, diazepines, or the like. The nitrogen-containing aliphatic heterocyclic or heteroaromatic amines may optionally include one or more additional heteroatoms such as oxygen or sulfur as ring members (e.g., oxazines, morpholines, oxazoles, thiazoles, thiazines, and the like). In certain aspects, preferred are moieties including a hydrocarbon-substituted amino group where the nitrogen atom is connected directly to an aromatic ring as a substituent rather than as a ring member.

The amine-containing polymer of the coating composition may be a polymer, copolymer, or oligomer. The amine-containing polymer may be a homopolymer having the same repeating structural units. The amine-containing polymer may be a copolymer having two or more repeating structural units that are not the same and may be, for example, a random or block copolymer. As used herein for the sake of convenience, the amine-containing polymer refers to both homopolymers, copolymers, and oligomers unless clearly indicated otherwise by the context. For example, when the coating composition is described as being an amine-containing homopolymer, the compound is a polymer and not a copolymer. Similarly, when the coating composition is described as being an amine-containing copolymer, the compound is a copolymer and not a homopolymer. An oligomer may have the same repeating structural units or two or more repeating structural units.

In an embodiment, the amine-containing polymer includes one or more repeating structural units represented by at least one of Formulae (1) or (2):

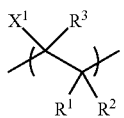

(1)

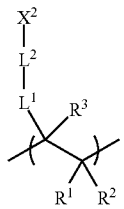

(2)

In Formulae (1) and (2), $R^1$ to $R^3$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group. In a preferred embodiment, $R^1$ to $R^3$ are hydrogen.

In Formulae (1) and (2), $L^1$ is a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —O—, —C(=O)O—, —O(C=O)—, —CONR$^b$—, or —OC(=O)NR$^b$—. In a preferred embodiment, $L^1$ is a $C_{6-30}$ arylene group, —C(=O)O—, or —CONR$^b$—.

In Formulae (1) and (2), $L^2$ is a single bond, a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —(C(R$^c$)=N—(C$_{2-3}$)alkylene)$_n$-, —(NR$^b$—(C$_{2-3}$)alkylene)$_n$-, or —(O—(C$_{2-3}$)alkylene)$_n$-; and each n is independently an integer from 1 to 20. In a preferred embodiment, $L^2$ is single bond, a $C_{1-10}$ alkylene group, a $C_{2-10}$ alkenylene group, a $C_{1-20}$ heteroalkene group, a $C_{3-7}$ heterocycloalkylene group, a $C_{6-12}$ arylene group, a $C_{3-12}$ heteroarylene group, —(C(R$^c$)=N—(C$_{2-3}$)alkylene)$_n$-, —(NR$^b$—(C$_{2-3}$)alkylene)$_n$-, or —(O—(C$_{2-3}$)alkylene)$_n$-; each n is independently an integer from 1 to 5.

In Formulae (1) and (2), $X^1$ is —N(R$^b$)$_2$ or a substituted or unsubstituted nitrogen-containing monocyclic, polycyclic, or fused polycyclic $C_{2-7}$ heterocycloalkyl group or $C_{3-30}$ heteroaryl group. In a preferred embodiment, $X^1$ is a substituted or unsubstituted nitrogen-containing monocyclic $C_{2-7}$ heterocycloalkyl group or $C_{3-30}$ heteroaryl group.

In Formulae (1) and (2), $X^2$ is —C(R$^c$)=NR$^b$, —N=C(R$^c$)$_2$, —N(R$^b$)$_2$, —(NR$^b$—(C$_{2-3}$)alkylene)$_n$-N(R$^b$)$_2$, —(O—(C$_{2-3}$)alkylene)$_n$-N(R$^b$)$_2$, or a substituted or unsubstituted nitrogen-containing monocyclic, polycyclic, or fused polycyclic $C_{2-7}$ heterocycloalkyl group or $C_{3-30}$ heteroaryl group. In a preferred embodiment, $X^2$ is —C(R$^c$)=NR$^b$, —N=C(R$^c$)$_2$, —N(R$^b$)$_2$, —(NR$^b$—(C$_{2-3}$)alkylene)$_n$-N(R$^b$)$_2$, —(O—(C$_{2-3}$)alkylene)$_n$-N(R$^b$)$_2$, or a substituted or unsubstituted nitrogen-containing monocyclic $C_{2-7}$ heterocycloalkyl group or $C_{3-30}$ heteroaryl group.

Further in Formulae (1) and (2), each R$^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group. In a preferred embodiment, each R$^b$ is independently hydrogen, a substituted or unsubstituted $C_{1-10}$ alkyl group, a substituted or unsubstituted polycyclic or monocyclic $C_{3-10}$ cycloalkyl group, or a substituted or unsubstituted polycyclic or monocyclic $C_{6-12}$ aryl group.

Further in Formulae (1) and (2), each R$^c$ is independently hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{1-30}$ alkoxy group, a substituted or unsubstituted $C_{3-30}$ cycloalkyl group, a substituted or unsubstituted $C_{3-30}$ cycloalkenyl group, a substituted or unsubstituted $C_{6-30}$ aryl group, a substituted or unsubstituted $C_{6-30}$ aryloxy group, a substituted or unsubstituted $C_{6-30}$ arylthio group, or a substituted or unsubstituted $C_{7-30}$ arylalkyl group. In a preferred embodiment, each R$^c$ is independently hydrogen, a halogen, a substituted or unsubstituted $C_{1-10}$ alkyl group, a substituted or unsubstituted $C_{2-10}$ alkenyl group, a substituted or unsubstituted $C_{2-10}$ alkynyl group, a substituted or unsubstituted $C_{1-10}$ alkoxy group, a substituted or unsubstituted $C_{3-10}$ cycloalkyl group, a substituted or unsubstituted $C_{3-10}$ cycloalkenyl group, a substituted or unsubstituted $C_{6-12}$ aryl group, a substituted or unsubstituted $C_{6-12}$ aryloxy group, a substituted or unsubstituted $C_{6-12}$ arylthio group, or a substituted or unsubstituted $C_{7-10}$ arylalkyl group.

Exemplary repeat units of Formulae (1) and (2) include structures such as the following:

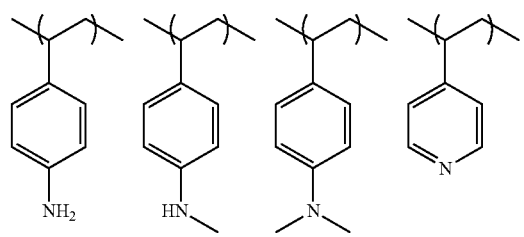

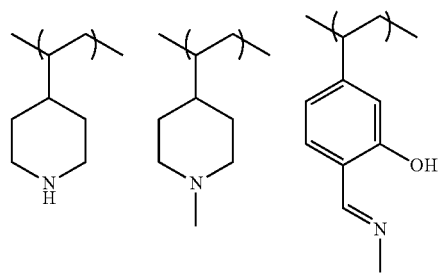

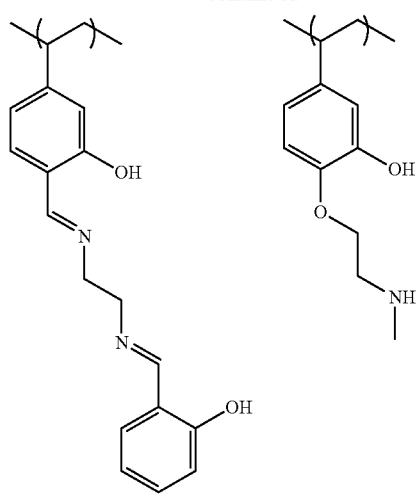
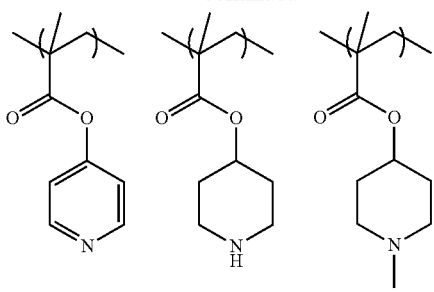
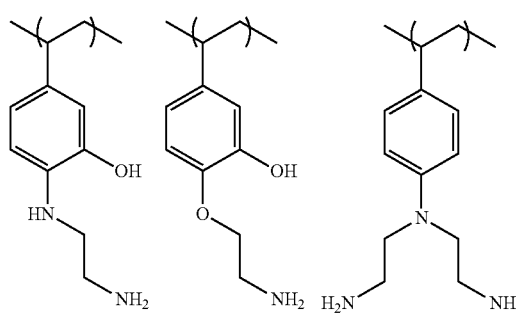
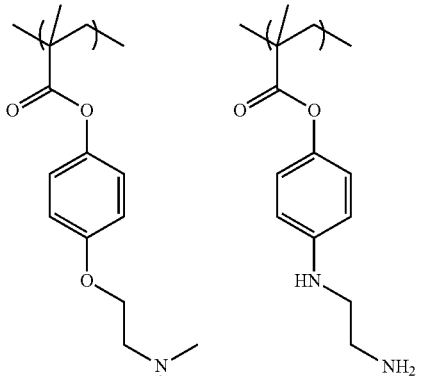
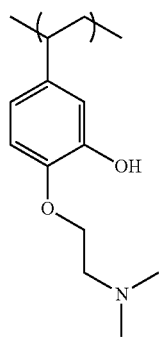
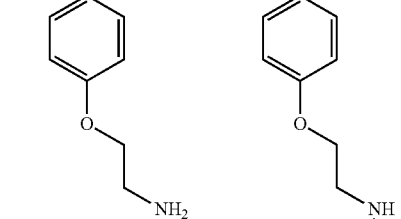
Exemplary repeat units of Formula (2) further include structures such as the following:
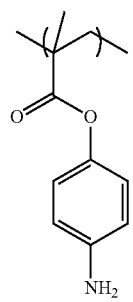
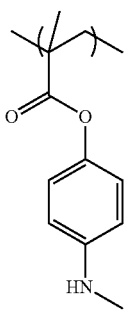
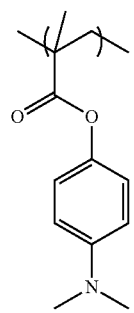
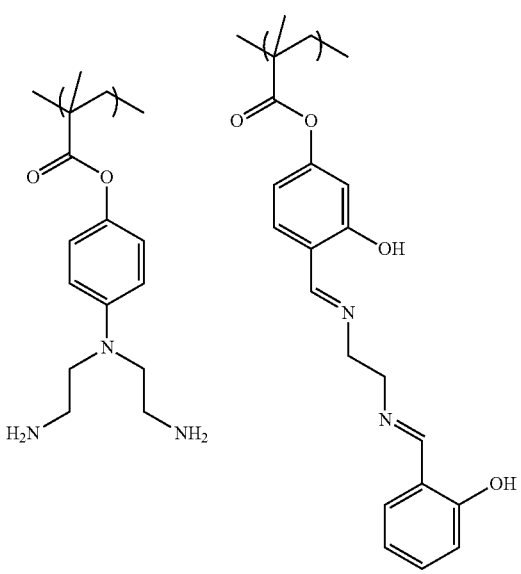

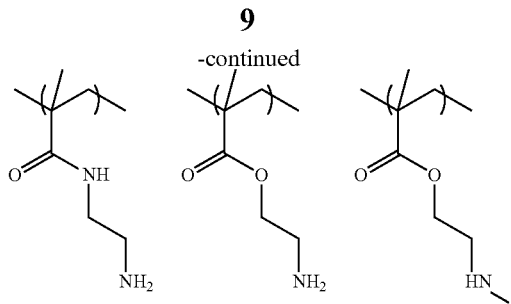
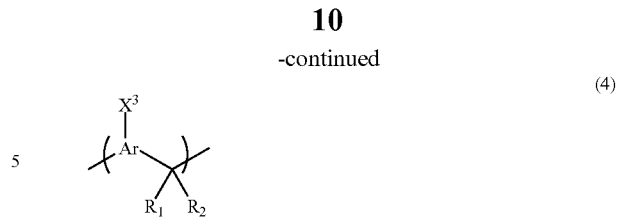
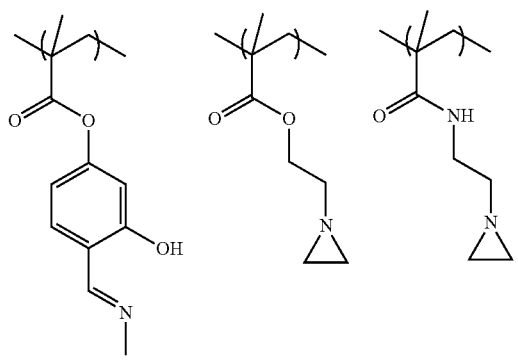

In Formulae (3) and (4), $R^1$ and $R^2$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group. In a preferred embodiment, $R^1$ and $R^2$ are hydrogen.

In Formulae (3) and (4), $Q^2$ is a substituted or unsubstituted aliphatic group, a substituted or unsubstituted cycloaliphatic group, a substituted or unsubstituted aromatic group, a substituted or unsubstituted heteroaromatic group, and combinations thereof, optionally with one or more linking moiety chosen from —O—, —N($R^b$)—, —COO—, —CONR$^b$—, —CONR$^b$—, and —OCONR$^b$—, and wherein $Q^2$ is optionally a branching group connected to at least two repeat units represented by Formula (3). In a preferred embodiment, $Q^2$ is a substituted or unsubstituted aliphatic group, a substituted or unsubstituted cycloaliphatic group, a substituted or unsubstituted aromatic group, a substituted or unsubstituted heteroaromatic group, and combinations thereof, optionally with one or more linking moiety chosen from —O—, —N($R^b$)—, —COO—, —CONR$^b$—, —CONR$^b$—, and —OCONR$^b$—.

In Formulae (3) and (4), Ar is a substituted or unsubstituted $C_{6-18}$ arylene group or a substituted or unsubstituted $C_{3-18}$ heteroarylene group. In a preferred embodiment, Ar is a substituted or unsubstituted phenylene group.

In Formulae (3) and (4), $X^3$ is —N($R^b$)$_2$ or a substituted or unsubstituted nitrogen-containing monocyclic, polycyclic, or fused polycyclic $C_{2-7}$ heterocycloalkyl group or $C_{3-30}$ heteroaryl group. In a preferred embodiment, $X^3$ is —N($R^b$)$_2$.

Further in Formulae (3) and (4), $R^a$ is hydrogen or a substituted or unsubstituted $C_{1-30}$ alkyl group. In a preferred embodiment, $R^a$ is hydrogen.

Further in Formulae (3) and (4), each $R^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group. In a preferred embodiment, each $R^b$ is independently hydrogen, a substituted or unsubstituted $C_{1-10}$ alkyl group, a substituted or unsubstituted polycyclic or monocyclic $C_{3-10}$ cycloalkyl group, or a substituted or unsubstituted polycyclic or monocyclic $C_{6-12}$ aryl group.

In an embodiment, the amine-containing polymer includes one or more repeating structural units represented by at least one of Formulae (3) or (4):

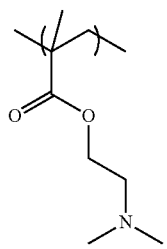

(3)

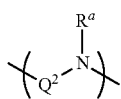

Exemplary repeat units of Formulae (3) or (4) include structures such as the following:

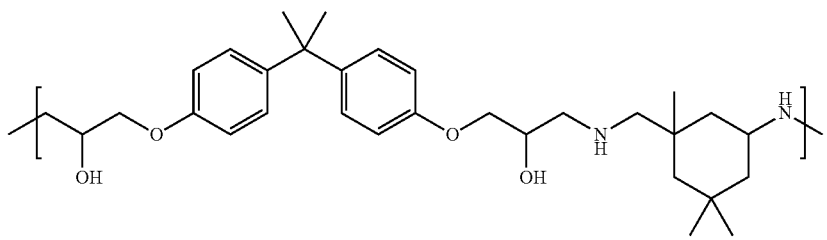

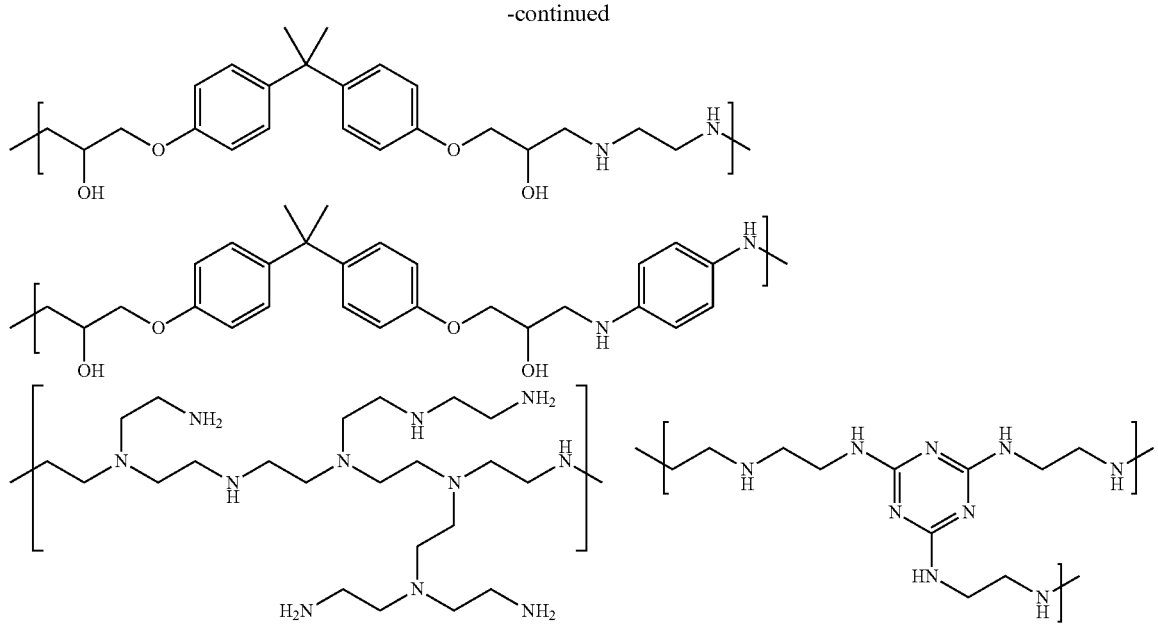

The amine-containing polymer may further include structural units that do not include amino groups described herein. Preferred units are those having substituents that are reactive with crosslinking agents, and may include units having pendant hydroxyl groups, thiol groups, epoxy groups, and the like. Exemplary repeating structural units providing crosslinking functionality, herein referred to as "crosslinkable units", include the following:

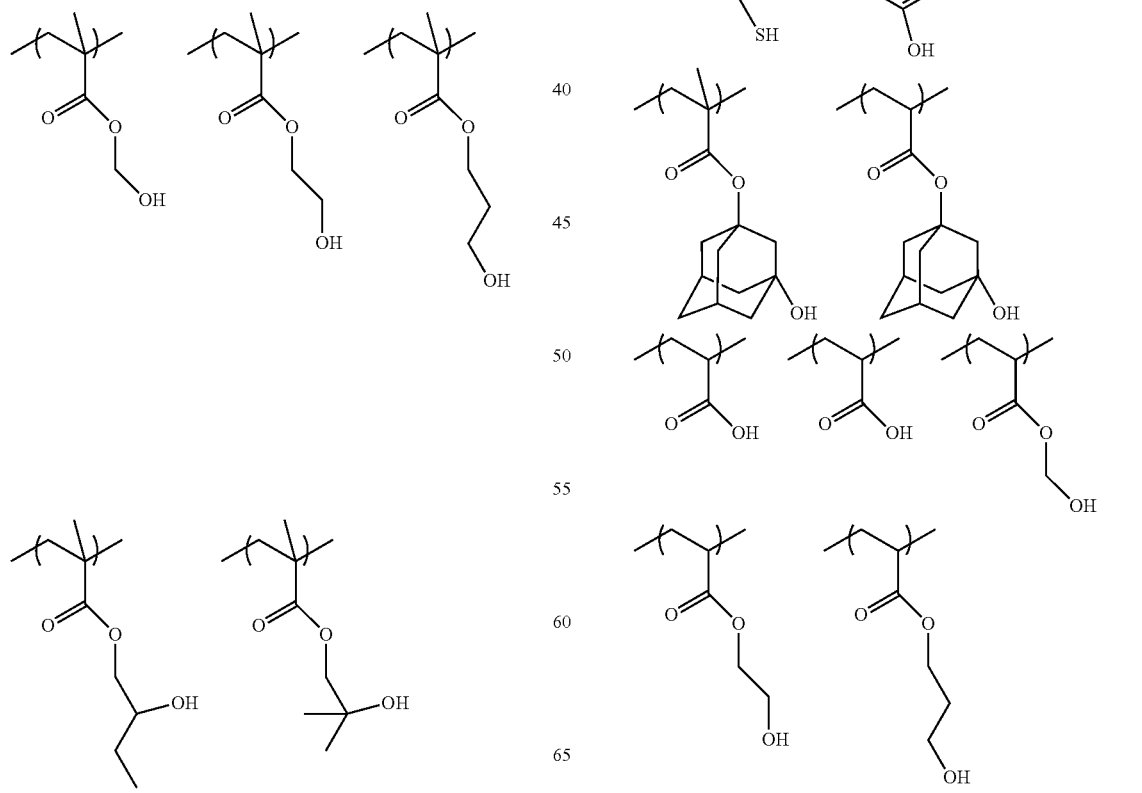

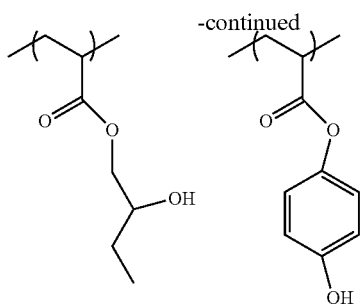

The crosslinkable units may be present in the amine-containing polymer in an amount of from 1 to 70 mole percent (mol %), for example, from 1 to 50 mol %, from 1 to 20 mol %, or from 1 to 10 mol %, based on the polymer.

Other repeating structural units may include, for example, one or more additional units for purposes of adjusting properties of the coating composition, such as etch rate and solubility. Exemplary additional units may include one or more of (meth)acrylate for solubility; vinyl ether, vinyl ketone, and vinyl ester for faster etch rate; preferably without crosslinkable groups on the sidechain. The one or more additional units if present in the amine-containing polymer may be used in an amount of up to 69 mol %, preferably from 5 to 50 mol % based on the polymer.

The amine-containing polymer may be prepared using any method in the art. For example, one or more monomers corresponding to the structural units described herein and including a polymerizable group may be combined as a monomer composition and the monomers subsequently polymerized to form the amine-containing polymer. Exemplary polymerizable groups include, but are not limited to, (meth)acrylate, glycidyl ether, N-vinyl, vinylether, vinylester, vinylamide, styrene, (meth)acrylamide, cyanoacrylate, 1,3-diene, vinylcarbonate, vinylcarbamate, maleimide, alpha-olefin, itaconic acid, vinylsilane, alkoxysilane, halosilane, alkynyl, and the like. The amine-containing polymer may be obtained by polymerization of the monomer composition under any suitable conditions, for example by heating at an effective temperature, irradiation with actinic radiation at an effective wavelength, or a combination thereof. The monomer composition may further include additives, such as a solvent, a polymerization initiator, a curing catalyst, and the like.

Examples of such solvents include, but are not limited to: hydrocarbons, such as alkanes, fluorinated hydrocarbons, and aromatic hydrocarbons, ethers, ketones, esters, alcohols, and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

As discussed above, curable coating compositions also may comprise a polymerization or curing catalyst to facilitate hardening (curing) of the applied composition layer. A variety of polymerization catalysts may be employed, including, for example, one or more free-radical polymerization catalyst(s).

The amine-containing polymer may have a weight average molecular weight ($M_w$) of 1,000 to 100,000 grams per mole (g/mol), preferably 2,000 to 50,000 g/mol, more preferably 2,500 to 25,000 g/mol, even more preferably 3,000 to 20,000 g/mol. Molecular weight may be determined by gel permeation chromatography (GPC). Preferable molecular weights will allow for higher yields during synthesis and lower swelling/higher stripping resistance to solvents with which the coating compositions come into contact in use, for example, solvents used in gap filling, bottom antireflective coating (BARC), photoresist, and developer materials. Higher swelling/lower stripping resistance may result in pattern collapse during patterning of the overcoated photoresist.

The polydispersity index (PDI) of the amine-containing polymer is not particularly limited. In an embodiment, the PDI is 1.05 or greater, preferably 1.05 to 2.0, more preferably 1.2 to 2.0.

In an embodiment, the coating composition may further include a crosslinking agent or crosslinker. Any suitable crosslinking agent may be used provided it is reactive with a substituent group of the amine-containing polymer. For example, the crosslinking agent may be reactive with the amino groups of the amine-containing polymer. Exemplary crosslinking agents reactive with the amino groups include polymers having pendant reactive groups such as epoxy, isocyanate, lactone, and the like. For example, the crosslinking agent may be a polymer or oligomer having a repeating unit derived from a crosslinking monomer such a glycidyl (meth)acrylic ester, a (meth)acrylic ester having a lactone group, and the like.

In addition to, or alternatively to, being reactive with the amino groups of the amine-containing polymer, the crosslinking agent may be reactive with a pendant group of another substituent, such as a hydroxyl group, a thiol group, an epoxy group, or another suitably reactive group of the polymer. Suitable crosslinking agents include any which may undergo acid catalyzed crosslinking with reactive groups of the amine-containing polymer. Exemplary crosslinking agents include, but are not limited to, di-, tri-, tetra-, or higher multi-functional ethylenically unsaturated monomers. Specific crosslinking agents include, for example: trivinylbenzene, divinyltoluene; divinylpyridine, divinylnaphthalene, divinylxylene, ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propylene glycol dimethacrylate, propylene glycol diacrylate, trimethylolpropane trimethacrylate, divinyl benzene, glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly (butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane), tetra($C_1$-$C_8$)alkoxyglycoluril such as tetramethoxyglycoluril and tetrabutoxyglycoluril, and combinations thereof. Suitable crosslinking agents are commercially available. The crosslinking agent may typically be present in an amount of from 4 to 25 wt %, for example, from 10 to 22 wt % based on the total solids of the coating composition.

The coating composition may include an added acid source such as an acid or acid generator compound, such as a thermal acid generator (TAG) compound whereby the applied coating composition may be hardened such as by thermal treatment prior to application of an overcoated photoresist layer. TAG compounds generate acid upon thermal treatment, such as an ionic or substantially neutral thermal acid generator, e.g., an ammonium arene sulfonate salt such as p-toluenesulfonic acid ammonium salts, for catalyzing or promoting crosslinking during curing of composition coating layer. For example, one or more thermal acid generators may be present in the composition in an amount from 0.1 to 10 wt % of the total of the dry components of the composition (all components except solvent carrier), more preferably 0.5 to 2 wt % of the total dry components.

The coating composition may be formulated with one or more photoacid generators. Suitable photoacid generator for use in an underlayer coating composition include photoacid generators disclosed herein for an overcoated photoresist composition. See U.S. Pat. No. 6,261,743 for a discussion of such use of a photoacid generator in an underlying coating composition. For example, the photoacid generator may be a small molecule compound of Formula (5):

$$G^+Z^- \quad (5)$$

wherein G if of Formula (6):

(6)

In Formula (6), X may be S or I. Each $R^0$ is attached to X and may independently be a $C_{1-30}$ alkyl group; a polycyclic or monocyclic $C_{3-30}$ cycloalkyl group; a polycyclic or monocyclic $C_{6-30}$ aryl group; or a combination comprising at least one of the foregoing. r5 may be 2 or 3, provided that when X is I, r5 is 2, and when X is S, r5 is 2 or 3. In Formula (5), Z may include the anion of a sulfonic acid, a sulfonimide, or a sulfonamide.

For example, cation $G^+$ may be of Formulae (7), (8), or (9):

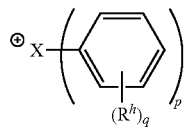

(V)

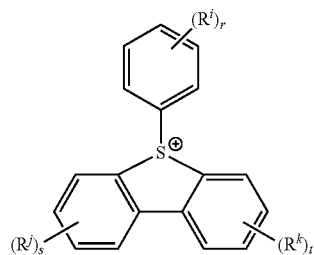

(VI)

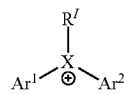

(VII)

wherein X is I or S, $R^h$, $R^i$, $R^j$, and $R^k$ are unsubstituted or substituted and are each independently hydroxy, nitrile, halogen, $C_{1-30}$ alkyl, $C_{1-30}$ fluoroalkyl, $C_{3-30}$ cycloalkyl, $C_{1-30}$ fluorocycloalkyl, $C_{1-30}$ alkoxy, $C_{3-30}$ alkoxycarbonylalkyl, $C_{3-30}$ alkoxycarbonylalkoxy, $C_{3-30}$ cycloalkoxy, $C_{5-30}$ cycloalkoxycarbonylalkyl, $C_{5-30}$ cycloalkoxycarbonylalkoxy, $C_{1-30}$ fluoroalkoxy, $C_{3-30}$ fluoroalkoxycarbonylalkyl, $C_{3-30}$ fluoroalkoxycarbonylalkoxy, $C_{3-30}$ fluorocycloalkoxy, $C_{5-30}$ fluorocycloalkoxycarbonylalkyl, $C_{5-30}$ fluorocycloalkoxycarbonylalkoxy, $C_{6-30}$ aryl, $C_{6-30}$ fluoroaryl, $C_{6-30}$ aryloxy, or $C_{6-30}$ fluoroaryloxy, each of which is unsubstituted or substituted; $Ar^1$ and $Ar^2$ are independently $C_{10-30}$ fused or singly bonded polycyclic aryl groups; $R^l$ is a lone pair of electrons where X is I, or a $C_{6-20}$ aryl group where X is S; p is an integer of 2 or 3, wherein when X is I, p is 2, and where X is S, p is 3, q and r are each independently an integer from 0 to 5, and s and t are each independently an integer from 0 to 4.

In Formulae (7), (8), and (9), at least one of $R^h$, $R^i$, $R^j$, and $R^k$ may be an acid-cleavable group. In an embodiment, the acid-cleavable group may be (i) a tertiary $C_{1-30}$ alkoxy (for example, a tert-butoxy group), a tertiary $C_{3-30}$ cycloalkoxy group, a tertiary $C_{1-30}$ fluoroalkoxy group, (ii) a tertiary $C_{3-30}$ alkoxycarbonylalkyl group, a tertiary $C_{5-30}$ cycloalkoxycarbonylalkyl group, a tertiary $C_{3-30}$ fluoroalkoxycarbonylalkyl group, (iii) a tertiary $C_{3-30}$ alkoxycarbonylalkoxy group, a tertiary $C_{5-30}$ cycloalkoxycarbonylalkoxy group, a tertiary $C_{3-30}$ fluoroalkoxycarbonylalkoxy group, or (iv) a $C_{2-30}$ acetal group including moiety —O—C($R^{11}R^{12}$)—O— (wherein $R^{11}R^{12}$ are each independently hydrogen or a $C_{1-30}$ alkyl group).

The amount of the photoacid generator may be 1 to 15 wt %, for example, 4 to 10 wt %, based on the total weight of the composition.

The coating composition may include one or more optional additives including, for example, surfactants and antioxidants. Such optional additives if used are each typically present in the coating composition in minor amounts such as from 0.01 to 10 wt % based on total solids of the coating composition.

Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co.

of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL™ and DYNOL™. Additional suitable surfactants include other polymeric compounds such as the tri-block EO-PO-EO co-polymers PLURONIC™ 25R2, L121, L123, L31, L81, L101 and P123 (BASF, Inc.).

The coating compositions may be prepared following known procedures. For example, the coating compositions may be prepared by dissolving the solid components of the composition in a solvent. The desired total solids content of the compositions will depend on factors such as the desired final layer thickness. Typically, the solids content of the coating compositions is from 1 to 20 wt %, for example, from 1 to 10 wt %, more typically, from 1 to 5 wt %, based on the total weight of the coating composition.

To make a liquid coating composition, the components of the coating composition may be dissolved in a suitable solvent such as, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from 0.5 to 20 wt % of the total weight of the coating composition, preferably the solid content varies from 0.5 to 10 wt % of the coating composition.

The coating composition may be applied as a coating layer to the substrate by any suitable method including spin-coating, dipping, roller-coating or other conventional coating technique. Preferably, the coating composition is applied by spin coating. For spin-coating, the solids content of the coating composition may be adjusted to provide a desired film thickness based upon the specific coating equipment utilized, the viscosity of the solution, the speed of the coating tool and the amount of time allowed for spinning. The coating composition in general is applied on a substrate with a dried layer thickness of 0.02 and 0.5 micrometers (μm), preferably a dried layer thickness of 0.04 and 0.20 μm.

The coating composition layer may be formed as a single layer or as multiple layers. For example, prior to forming the coating composition layer, a second coating composition layer that is different from the first coating composition layer may be formed on the substrate, and the first coating composition layer is formed (i.e., disposed) on the second coating composition layer.

Substrates may be any dimension and shape, and are preferably those useful for photolithography, such as silicon, silicon dioxide, silicon-on-insulator (SOI), strained silicon, gallium arsenide, and coated substrates. The substrate may include one or more layers. The layers contained in the substrate may be one or more conductive layers of aluminum, copper, molybdenum, manganese, iron, nickel, copper, zinc, palladium, silver, cadmium, tantalum, titanium, tungsten, platinum, mercury, or alloys thereof; nitrides or silicides; doped amorphous silicon or doped polysilicon; a dielectric layer such as a layer of silicon oxide, silicon nitride, a silicon oxynitride, or a metal oxide; a semiconductor layer such as single-crystal silicon; a glass layer; a quartz layer; or combinations or mixtures thereof, but are not limited thereto. Preferably, the uppermost layer of the substrate, or the outermost layer of the substrate, includes (for example, is coated with) a soft metal such as manganese, iron, nickel, copper, zinc, palladium, silver, cadmium, tantalum, tungsten, platinum, mercury, or alloys thereof. Each layer may be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

In an aspect, the uppermost layer of the substrate includes a relief image that defines gaps to be filled. The gaps to be filled may be present in the base substrate material itself or in a layer formed over the base substrate material and may take various forms. The gaps may, for example, take the form of trenches or holes and, preferably may be narrow in width and having high aspect ratios. Accordingly, in some aspects the coating composition is a gap-fill composition.

The relief image typically is formed by a lithographic process, for example, a photolithographic or assembly process such as directed assembly (DSA). An etching process such as an anisotropic dry etch is typically used for pattern transfer to an underlying layer from which the relief image and gaps are formed. The gaps may take the form, for example, of holes, trenches or spaces between lines or other surface features. For example, the gaps may extend completely through the material layer from which the relief image is formed, exposing the underlying substrate. It may be preferable that the gaps extend only partially through the material layer. In the case of a photolithography process, it is preferable to use an exposure radiation less than 300 nm in wavelength such as 248 nm, 193 nm or an EUV wavelength (e.g., 13.4 or 13.5 nm), or electron beam exposure. The gaps may take the form, for example, of trenches or holes having a height h and a width w, and may be of relatively narrow width and large height. Processes and compositions in accordance with the disclosure are suitable for use in the filling of gaps having relatively high aspect ratios. As used herein, aspect ratio (AR) is defined as AR=h/w, wherein h is the gap height and w is the gap width. Typically, the gap width is from 1 nm to 200 nm, for example, 1 nm to 100 nm, 1 nm to 50 nm, 1 nm to 25 nm or from 1 to 10 nm, and is preferably less than 50 nm, for example, less than 20 nm, less than 15 nm, less than 10 nm, or less than 5 nm. The aspect ratio is typically from 1 to 20, for example, from 2 to 20 or from 5 to 20.

After being applied on the substrate, the coating composition is optionally softbaked at a relatively low temperature to remove any solvent and other relatively volatile components from the coating composition layer. Typically, the substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate.

The applied coating composition may be optionally thermally treated prior to overcoating with another composition or layer. Such thermal treatment may cause hardening including crosslinking of the coating composition. Such crosslinking may include hardening and/or covalent-bonding forming reactions between one or more composition components and may modulate water contact angle of the coating composition layer. For example, the applied coating composition layer may be cured after being disposed on the substrate. Cure conditions will vary with the components of the coating composition. Cure conditions may render the coating composition coating layer substantially insoluble to the solvent used to apply subsequent layer(s) as well as an alkaline aqueous developer solution.

For example, the coating composition layer may be sufficiently cured such that the layer does not intermix with a subsequently applied layer, such as a photoresist or other organic layer disposed directly on the underlayer. The coating composition layer may be cured in an oxygen-containing atmosphere, such as air, or in an inert atmosphere, such as nitrogen and under conditions, such as heating, sufficient to provide a cured coating layer. Exemplary curing is by heating the coating composition layer at a curing temperature of 150° C. or greater, and preferably 150 to 450° C. It is more preferred that the curing temperature is 180° C. or greater, still more preferably 200° C. or greater, and even more preferably from 200 to 400° C. When a thermal acid generator is used, the curing temperature should be sufficient for the thermal acid generator to liberate acid to aid in curing of the coating composition. The curing time may be from 10 seconds to 10 minutes, preferably from 30 seconds to 5 minutes, more preferably from 45 seconds to 5 minutes, and stilly more preferably from 45 to 90 seconds. The curing temperature may be selected based on the desired curing rate to achieve a cured coating composition layer.

The initial baking step may not be necessary if the curing step is conducted in such a way that rapid evolution of the solvents and curing by-products is not allowed to disrupt the film quality. For example, a ramped bake beginning at relatively low temperatures and then gradually increasing to the range of 200 to 325° C. may give acceptable results. It may be preferable in some cases to have a two-stage curing process, with the first stage being a lower bake temperature of less than 200° C., and the second stage being a higher bake temperature preferably between 200 and 400° C. Two stage curing processes facilitate uniform filling and planarization of pre-existing substrate surface topography, for example filling of trenches and vias.

After curing of the coating composition layer, one or more processing layers, such as a photoresist layer, a silicon-containing layer, a hardmask layer, a BARC layer, and the like, may be disposed on the cured underlayer. As used herein, an "organic layer" refers to an organic BARC layer. For example, a photoresist may be disposed, such as by spin coating, directly on the surface of the cured aromatic resin underlayer. The cured coating layer may be an underlayer to a photoresist composition, as described below. Alternatively, the cured coating layer may be used as the bottom layer of a multilayer resist process, where one or more additional layers may be disposed between the cured coating layer and the photoresist layer. In such a process, a layer of the coating composition is disposed on a substrate and cured as described above. Next, one or more additional layers are disposed on the coating composition layer. For example, a silicon-containing layer or a hardmask layer is disposed directly on the coating composition layer. Exemplary silicon-containing layers include a silicon-BARC, which may be spin coated on the underlayer followed by curing, or an inorganic silicon layer such as SiON or $SiO_2$, which may be deposited on the coating composition layer by chemical vapor deposition (CVD). Any suitable hardmask may be used and may be deposited on the coating composition layer by any suitable technique and cured as appropriate. Optionally, an organic BARC layer may be disposed directly on the silicon-containing layer or hardmask layer, and appropriately cured. Next, a photoresist, such as those used in 193 nm lithography, is disposed directly on the silicon-containing layer (in a trilayer process) or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the coating composition layer is then patterned using appropriate etching techniques, such as $O_2$ plasma. Any remaining patterned photoresist and organic BARC layers are removed during etching of the coating composition layer. Next, the pattern is then transferred to the substrate, such as by appropriate etching techniques, which also removes any remaining silicon-containing layer or hardmask layer, followed by removal of any remaining patterned coating composition layer to provide a patterned substrate.

A layer of a photoresist composition is then formed on the corresponding underlayer(s). For example, the photoresist composition may be applied directly to the coating composition layer, or there may be one or more interlayers sandwiched between the coating composition layer and the photoresist layer. The photoresist composition may include a matrix polymer, a photoacid generator, and a solvent.

The matrix polymer may include at least one unit having an acid-cleavable protecting group. The acid-cleavable protecting group may be, for example, acetal or ester groups that contain a tertiary non-cyclic alkyl carbon (for example, t-butyl) or a tertiary alicyclic carbon (for example, methyladamantyl) covalently linked to a carboxy oxygen of an ester of the matrix polymer.

Suitable units which may be included in the matrix polymer may be, for example, units derived from (alkyl) acrylate, for example, units derived from acid-cleavable (alkyl)acrylate. Particular examples thereof include units derived from t-butyl acrylate, t-butyl methacrylate, methyladamantyl acrylate, methyl adamantly methacrylate, ethylfenchyl acrylate, ethylfenchyl methacrylate, and the like.

Another example of suitable units which may be included in the matrix polymer may be units derived from a non-aromatic cyclic olefin (endocyclic double bond) such as an optionally substituted norbornene. Still another example of suitable units which may be included in the matrix polymer may be units derived from anhydrides, for example, maleic anhydride, itaconic anhydride, and the like.

Also, the matrix polymer may contain units that contain a heteroatom such as oxygen and sulfur, and, for example, a heterocyclic unit may be fused to the main chain of the matrix polymer. The matrix polymer may be used as a blend of two or more kinds. The matrix polymer may be commercially available or prepared by those skilled in the art.

The matrix polymer of the photoresist composition is used in an amount sufficient to render an exposed coating layer of the photoresist developable with a suitable solution, for example, 50 to 95 wt %, based on total solids of the coating composition. The weight average molecular weight ($M_w$) of the matrix polymer may be less than 100,000 g/mol, for example, from 5,000 to 100,000 g/mol, for example, 5,000 to 15,000 g/mol.

The photoresist composition may further include a photoactive material employed in an amount sufficient to generate a latent image in a coating layer of the composition upon exposure to activating radiation and may include a photoacid generator. Example photoacid generators include those as described above.

The photoresist composition may include a solvent, for example, glycol ether such as 2-methoxyethyl ether, ethylene glycol monomethyl ether and propylene glycol monomethyl ether; propylene glycol monomethyl ether acetate; lactates such as ethyl lactate and methyl lactate; propionate such as methyl propionate, ethyl propionate, ethyl ethoxy propionate and methyl-2-hydroxyisobutyrate; methyl cellosolve acetate; aromatic hydrocarbon such as toluene and xylene; ketone such as acetone, methyl ethyl ketone, cyclohexanone and 2-heptanone. Such solvents may be used alone or in combination of two or more solvents.

The photoresist composition may be applied on to the underlaying layer(s) by spin coating, dipping, roller coating or other conventional coating technique. For example, spin coating may be used. For the spin coating, the solids content of the coating solution may be adjusted to provide a desired film thickness based upon the specific coating equipment utilized, the viscosity of the solution, the speed of the coating tool and the amount of time allowed for spinning.

A thickness of the photoresist composition layer may be, for example, 50 nm to 300 nm.

Next, the photoresist composition layer may be softbaked to minimize the solvent content in the layer, thereby forming a tack-free coating and improving adhesion of the layer to the substrate. The soft-bake may be conducted on a hotplate or in an oven. The soft-bake temperature and time will depend on the particular material of the photoresist and thickness. For example, typical soft-bakes are conducted at a temperature of from 90° C. to 150° C. for 30 seconds to 90 seconds.

Additionally, an overcoating layer may be formed on the photoresist composition layer. The overcoating layer may be formed for uniform resist pattern, reduction of reflectance during the exposure process of the resist, improved depth of focus and exposure latitude and reduction in defects. The overcoating layer may be formed by spin coating technique using an overcoating composition. The solids content of the coating solution may be adjusted to provide a desired film thickness based upon the specific coating equipment utilized, the viscosity of the solution, the speed of the coating tool and the amount of time allowed for spinning A thickness of the overcoating layer may be, for example 200 Angstroms (Å) to 1,000 Å.

The overcoating layer may be soft-baked to minimize the solvent content in the layer. The soft-bake may be conducted on a hotplate or in an oven. Typical soft-bakes are conducted at a temperature of from 80° C. to 120° C. for 30 seconds to 90 seconds.

The photoresist composition layer is then exposed to activating radiation through a photomask to create a difference in solubility between exposed and unexposed regions. The photomask has optically transparent and optically opaque regions.

The exposure wavelength may be, for example, 400 nm or less, 300 nm or less, or 200 nm or less, for example, 248 nm (for example, KrF excimer laser light) or 193 nm (for example, ArF excimer laser light. The exposure energy is typically from 10 to 80 millijoules per square centimeter (mJ/cm$^2$), dependent upon the exposure device and the components of the photosensitive composition.

After the exposure step of the photoresist composition layer, a post exposure bake (PEB) is conducted. PEB may be conducted on a hotplate or in an oven. PEB conditions may vary with the components of the photoresist composition layer and thickness. For example, typical PEB is conducted at a temperature of from 80° C. to 150° C. for 30 seconds to 90 seconds. Thus, a latent image is produced in the photoresist composition layer due to difference in solubility between light exposed and unexposed regions.

The overcoating layer and the exposed photoresist composition layer are then developed to remove unexposed regions, thus forming a resist pattern. The developer is typically an organic developer, for example, a solvent selected from ketones, esters, ethers, amides, hydrocarbons, and mixtures thereof. Examples of suitable ketone include acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Examples of suitable ester include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Examples of suitable ether include dioxane, tetrahydrofuran and glycol ether (for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol). Examples of suitable amide include N-methyl-2-pyrrolidone, N,N-dimethylacetamide and N,N-dimethylformamide. Examples of suitable hydrocarbon include aromatic hydrocarbon solvents (for example, toluene and xylene).

The developer may contain a solvent which may be used in the photoresist composition, for example, 2-heptanone, butyl acetate (for example, n-butyl acetate). The developer may contain mixtures of these solvents, or one or more of the listed solvents mixed with a solvent other than those described above or mixed with water. For example, the developer may contain a mixture of a first organic solvent and a second organic solvent. Particular examples of the first organic solvent are $C_4$-$C_9$ ketones; hydroxyalkyl esters such as methyl 2-hydroxyisobutyrate, ethyl lactate; and linear or branched $C_5$-$C_6$ alkoxy alkyl acetate such as propylene glycol monomethyl ether acetate, for example, 2-heptanone or 5-methyl-2-hexanone. Examples of the second organic solvent are linear or branched $C_6$-$C_8$ alkyl esters such as n-butyl acetate, n-pentyl acetate, n-butyl propionate, n-hexyl acetate, n-butyl butyrate and isobutyl butyrate; and linear or branched $C_8$-$C_9$ ketones such as 4-octanone, 2,5-dimethyl-4-hexanone, 2,6-dimethyl-4-heptanone, for example, n-butyl acetate, n-butyl propionate or 2,6-dimethyl-4-heptanone. Examples of combinations of the first and the second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone, 2-heptanone/n-butyl acetate. Of these combinations, 2-heptanone/n-butyl acetate or 2-heptanone/n-butyl propionate may be preferred.

The solvent may be present in the developer in an amount of from 90 to 100 wt %, for example, greater than 95 wt %, greater than 98 t %, greater than 99 wt % or 100 wt %.

The developer may also include optional additives, for example, surfactants, and the like Such optional additives typically will be present in minor concentrations, for example, 0.01 to 5 wt %.

The developer may be applied on to the photoresist composition layer by known techniques, for example, spin coating or puddle coating. The development time is for a period effective to remove the unexposed regions of the photoresist. For example, the development is conducted for 5 to 30 seconds at room temperature.

The developed photoresist composition layer may be further cured by performing additional baking at a temperature of 100° C. to 150° C. for several minutes.

The developed substrate may have a substrate region from which a photoresist is removed, and the substrate region may be treated in a selective manner. For example, the substrate region from which the photoresist is removed may be chemically etched or plated using a method well known in the related art. A hydrofluoric acid etching solution, and a plasma gas etching agent such as an oxygen plasma etching agent may be used as an etching agent. For example, the coating composition layer may be removed, and the substrate may be etched using the plasma gas etching agent.

As described herein, a wet etch process may be suitably employed. Wet etching may be suitably carried out by exposing the surface to be etched (e.g. a metal nitride, or metal nitride coated with one or more organic and/or inorganic layers) with a wet etch composition for a time and temperature effective to etch the surface (e.g. metal nitride surface and/or coating layers thereon). Exemplary wet etching compositions include an aqueous mixture of ammonium hydroxide and a peroxide such as hydrogen peroxide, or a mixture of an acid such as sulfuric acid and a peroxide such as hydrogen peroxide. See US 2006/0226122 for exemplary compositions. The examples which follow also provide exemplary wet etch process conditions. As referred to herein, a "wet etch process" means treating substrate areas defined by an adjoining photoresist (after development of the photoresist image) with a fluid composition typically either acid or alkaline in combination with a peroxide agent, but in any event distinguished from a plasma dry etch.

When the coating composition is used as a gap-fill composition, further processing of the substrate is conducted to form a final device, which may include a memory (e.g., DRAM) or logic device. The further processing may include, for example, one or more of formation of a layer over the substrate, polishing, chemical-mechanical planarization (CMP), ion implantation, annealing, CVD, PVD, epitaxial growth, electroplating, and lithographic techniques such as DSA and photolithography. Preferably, coating of a liquid layer containing a solvent, for example, by spin-coating, directly over the crosslinked gap-fill composition, may be conducted without intermixing with the underlying crosslinked material.

The coating compositions are useful for various electronic devices, such as in a coated substrate that includes a substrate having disposed therein a layer of the coating composition and a layer of the photoresist composition disposed on the layer of the coating composition. The substrate, coating composition, and photoresist composition are as described herein. As used herein, "an overcoated photoresist composition" refers to the photoresist composition that has been applied to or disposed on the coating composition layer, either directly disposed on the coating composition layer or disposed on the coating composition layer with one or more interlayers between the photoresist layer and the coating composition layer as described herein.

The coating composition may be used to prepare wide variety of electronic device, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. The substrate materials are as described herein. The substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductive substrate" also includes any substrate having one or more semiconductor layers or structures which include active or operable portions of semiconductor devices. The term "semiconductor substrate" is also defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A "semiconductor device" refers to a semiconductor substrate upon which at least one microelectronic device has been or is being batch fabricated.

Hereinafter, the present disclosure is illustrated in more detail with reference to examples. However, these examples are exemplary, and the present disclosure is not limited thereto.

EXAMPLES

Synthesis of Polymers

Synthesis Example 1

A first round bottom flask (RBF) was charged with 22.15 g (0.14 mol) of 2-(dimethylamino)ethyl methacrylate (DMAEMA), 7.85 g (0.06 mol) of 2-hydroxyethyl methacrylate (HEMA), and 5.56 g of dimethyl-2,2-azodiisobutyrate (V601 initiator), and the contents were dissolved with 32.5 g of a solution (7:3 w/w) of ethyl lactate and gamma-butyrolactone (EL/GBL) (7:3 w/w) with stirring at about 23° C. A second RBF equipped with a condenser and a magnetic bar was charged with 37.5 g of EL/GBL. The solvent in the second RBF was heated at 80° C. with stirring and the monomer solution from the first RBF was transferred into the second RBF dropwise over 3 hours. After the transfer was completed, the reaction mixture was stirred at 80° C. for 1 hour. The reaction mixture was allowed to cool to about 23° C. and 1000 g of methyl-tert-butyl ether (MTBE) was added to precipitate the polymer product. The solvent mixture was decanted, and the polymer was dried under vacuum at 40° C. for 16 hours to give 27.2 g of a poly(DMAEMA- HEMA) copolymer having a DMAEMA:HEMA molar ratio of 68.9:31.1, a Mw of 7.3 kg/mol, and a PDI of 1.61.

Synthesis Example 2

A first RBF was charged with 19.6 g (0.19 mol) of 4-vinyl pyridine (PVP), 10.4 g (0.08 mol) of HEMA, and 2.03 g of V601 initiator, and the contents were dissolved with 37.5 g of butanol with stirring at about 23° C. A second RBF equipped with a condenser and a magnetic bar was charged with 37.5 g of butanol. The solvent in the second RBF was heated at 80° C. with stirring and the monomer solution from the first RBF was transferred into the second RBF dropwise over 3 hours. After the transfer was completed, the reaction mixture was stirred at 80° C. for 1 hour. The reaction mixture was allowed to cool to about 23° C. and 1000 g of heptane was added to precipitate the polymer product. The solvent mixture was decanted, and the polymer was dried under vacuum at 40° C. for 16 hours to give 29.4 g of a poly(PVP-HEMA) copolymer having a PVP:HEMA molar ratio of 69.8:30.2, a Mw of 6.8 kg/mol, and a PDI of 1.70.

Synthesis Example 3

A first RBF was charged with 22.8 g (0.13 mol) of 4-aminophenyl methacrylate (APMA), 7.2 g (0.06 mol) of HEMA, and 5.08 g of V601 initiator, and the contents were dissolved with 32.5 g of propylene glycol methyl ether with stirring at about 23° C. A second RBF equipped with a condenser and a magnetic bar was charged with 37.5 g of propylene glycol methyl ether. The solvent in the second RBF was heated at 80° C. with stirring and the monomer solution from the first RBF was transferred into the second RBF dropwise over 3 hours. After transfer was completed, the reaction mixture was stirred at 80° C. for 1 hour. The reaction mixture was allowed to cool to about 23° C. and 1000 g of MTBE was added to precipitate the polymer product. The solvent mixture was decanted, and the polymer was dried under vacuum at 40° C. for 16 hours to give 28.7 g of a poly(APMA-HEMA) copolymer having a APMA:HEMA molar ratio of 66.5:33.5, a Mw of 10.1 kg/mol, and a PDI of 1.66.

Synthesis Example 4

A first RBF was charged with 19.3 g (0.057 mol) of 2,2-bis(4-glycidyloxyphenyl)propane (BPDG) and dissolved with 20 g of anisole with stirring at about 23° C. A second RBF equipped with a condenser and a magnetic bar was charged with 13.6 g (0.080 mol) of isophoronediamine (IPDA) and 7.0 g (0.041 mol) of N,N-dibutylethane-1,2-diamine (DBEA) and the contents was dissolved with 20 g of anisole with stirring at about 23° C. The contents of the second RBF were heated at 80° C. with stirring and the solution from the first RBF was transferred into the second RBF dropwise over 2 hours. After the transfer was completed, the reaction mixture was stirred at 80° C. for 2 hours. The reaction mixture was allowed to cool to about 23° C. and 1000 g of isopropanol was added to precipitate the polymer product. The solvent mixture was decanted, and the polymer was dried under vacuum at 40° C. for 16 hours to give 18.8 g of a poly(BPDG-IPDA-DBEA) copolymer having a BPDG:IPDA:DBEA molar ratio of 46:39:15, a Mw of 3.7 kg/mol, and a PDI of 1.41. The copolymer is of the formula:

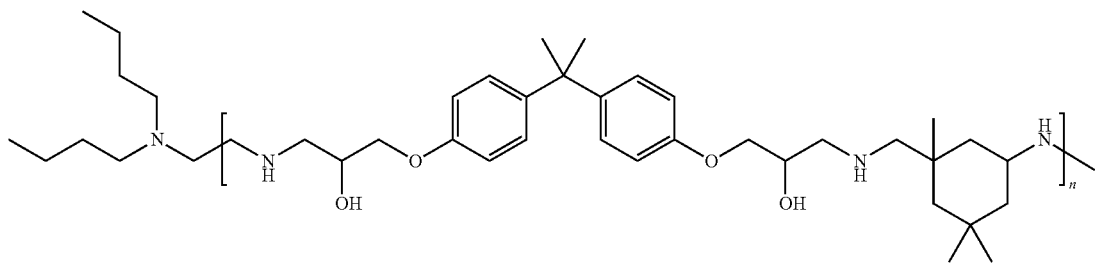

Comparative Synthesis Example 1

A first RBF was charged with 12.7 g (0.13 mol) of methyl methacrylate (MMA), 7.1 g (0.054 mol) of HEMA, and 1.51 g of V601 initiator, and the contents were dissolved with 32.5 g of propylene glycol methyl ether with stirring at about 23° C. A second RBF equipped with a condenser and a magnetic bar was charged with 37.5 g of propylene glycol methyl ether. The solvent in the second RBF was heated at 80° C. with stirring and the monomer solution from the first RBF was transferred into the second RBF dropwise over 3 hours. After transfer was completed, the reaction mixture was stirred at 80° C. for 1 hour. The reaction mixture was allowed to cool to about 23° C. and 1000 g of heptane was added to precipitate the polymer product. The solvent mixture was decanted, and the polymer was dried under vacuum at 40° C. for 16 hours to give 19.1 g of a poly(MMA-HEMA) copolymer having a MMA:HEMA molar ratio of 70.2:29.8, a Mw of 6.2 kg/mol, and a PDI of 1.70.

Coating Compositions

Example 1

4.80 g of the copolymer of Synthesis Example 1, 1.20 g of glycidyl methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Example 2

4.20 g of the copolymer of Synthesis Example 2, 1.80 g of glycidyl methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Example 3

3.00 g of the copolymer of Synthesis Example 3, 3.00 g of glycidyl methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Example 4

4.20 g of the copolymer of Synthesis Example 4, 1.80 g of lactone methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Example 5

3.00 g of polyethyleneimine, 3.00 g of glycidyl methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Comparative Example 1

2.07 g of the copolymer of Comparative Synthesis Example 1, 3.00 g of glycidyl methacrylate, and 0.003 g of POLYFOX 656 were dissolved in 94.00 g of 2-hydroxyisobutyric acid to obtain a solution. The solution was filtered through an ultrahigh molecular weight polyethylene membrane filter having a pore diameter of 0.45 μm to provide a coating composition.

Evaluation of Adhesion to Metal Substrate 200 mm bare silicon wafers were coated with a 1 nm layer of tungsten nitride (WN) in a flow reactor by atomic layer deposition (Nano-ALD2000, Korean National NanoFab Center). Deposition precursors of 97% bis(t-butylimido) bis(dimethylamino) tungsten (VI) (BTBMW) and $NH_3$ were each deposited at a mass flow of by 10 standard cubic centimeters per minute (SCCM) at a pressure of 0.34 Torr (45.33 Pa). The deposition cycle was repeated to provide WN metal wafers having a WN layer with a thickness of 1 nm.

Samples were prepared by spin coating the solutions of the coating compositions prepared in Examples 1 to 5 and Comparative Example 1 on WN metal wafers. For each sample, the applied coating composition was baked on a hot plate at 215° C. for 1 minute to form a resist under-layer film having a thickness of 100 nm. The resist under-layer film for each sample was immersed at about 23° C. in a wet etch solution containing ammonium hydroxide (35% aqueous solution), hydrogen peroxide (30% aqueous solution), and water in a weight ratio ($NH_4OH:H_2O_2:H_2O$) of 1:1:5.

The wet etch endurance, or adhesion performance, of each sample was evaluated by visual observation. The peel-off time of the coated film from the substrate was measured for each sample. Table 1 shows the visually-determined peel-off times for Examples 1 to 5 and Comparative Example 1. As demonstrated in Table 1, the samples including the amine-containing polymer (Examples 1 to 5) achieve a considerably longer peel-off time compared to the sample having a polymer without an amino group (Comparative Example 1). The results demonstrate the amino groups of the amine-containing polymers provide improved adhesion to the metal substrate.

TABLE 1

| Sample | Peel-off time |
| --- | --- |
| Example 1 | 2 minutes and 30 seconds |
| Example 2 | 2 minutes and 10 seconds |
| Example 3 | 3 minutes and 30 seconds |
| Example 4 | 5 minutes |
| Example 5 | greater than 10 minutes |
| Comparative Example 1 | less than 10 seconds |

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A method for forming a photoresist relief image, the method comprising:
    applying a layer of a coating composition on a substrate; and
    disposing a layer of a photoresist composition on the layer of the coating composition,
    wherein the coating composition comprises an amine-containing polymer comprising a hydrocarbon-substituted amino group and having nitrogen atoms in an amount from 3 to 47 weight percent, based on a total weight of the amine-containing polymer,
    wherein the amine-containing polymer comprises a repeating structural unit represented by at least one of Formulae (1) or (2):

wherein, in Formulae (1) and (2),
$R^1$ to $R^3$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group;
$L^1$ is a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —O—, —C(=O)O—, —O(C=O)—, —CONR$^b$—, or —OC(=O)NR$^b$—;

$L^2$ is a single bond, a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —(C(R$^c$)=N—(C$_{2-3}$)alkylene)$_n$-, —(NR$^b$—(C$_{2-3}$)alkylene)$_n$—, or —(O—(C$_{2-3}$ alkylene)$_n$-;

$X^1$ is —N(R$^b$)$_2$ or a substituted or unsubstituted nitrogen-containing monocyclic, polycyclic, or fused polycyclic $C_{2-7}$ heterocycloalkyl group or $C_{3-30}$ heteroaryl group;

$X^2$ is —C(R$^c$)=NR$^b$, —N=C(R$^c$)$_2$, —(NR$^b$—(C$_{2-3}$)alkylene)$_n$-N(R$^b$)$_2$, —(O—(C$_{2-3}$)alkylene)$_n$-N(R$^b$)$_2$, or a substituted or unsubstituted nitrogen-containing monocyclic, polycyclic, or fused polycyclic $C_{2-7}$ heterocycloalkyl group or $C_{3-30}$ heteroaryl group;

each R$^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group;

each R$^c$ is independently hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{1-30}$ alkoxy group, a substituted or unsubstituted $C_{3-30}$ cycloalkyl group, a substituted or unsubstituted $C_{3-30}$ cycloalkenyl group, a substituted or unsubstituted $C_{6-30}$ aryl group, a substituted or unsubstituted $C_{6-30}$ aryloxy group, a substituted or unsubstituted $C_{6-30}$ arylthio group, or a substituted or unsubstituted $C_{7-30}$ arylalkyl group; and each n is independently an integer from 1 to 20.

2. The method of claim 1, further comprising disposing an additional layer directly on the layer of the coating composition; and disposing the layer of the photoresist composition directly on the additional layer, wherein the additional layer comprises at least one of a hardmask layer, a silicon-containing layer, or organic layer.

3. The method of claim 1, wherein in Formulae (1) and (2), $R^1$ to $R^3$ are hydrogen;

$L^1$ is a $C_{6-30}$ arylene group, —C(=O)O—, or —CONR$^b$—;

$L^2$ is single bond, a $C_{1-10}$ alkylene group, a $C_{2-10}$ alkenylene group, a $C_{1-20}$ heteroalkene group, a $C_{3-7}$ heterocycloalkylene group, a $C_{6-12}$ arylene group, a $C_{3-12}$ heteroarylene group, —(C(R$^c$)=N—(C$_{2-3}$)alkylene)$_n$-, —(NR$^b$—(C$_{2-3}$)alkylene)$_n$-, or —(O—(C$_{2-3}$)alkylene)$_n$-;

$X^1$ is a substituted or unsubstituted nitrogen-containing monocyclic $C_{2-7}$ heterocycloalkyl group or $C_{3-30}$ heteroaryl group;

$X^2$ is —C(R$^c$)=NR$^b$, —N=C(R$^c$)$_2$, —(NR$^b$—(C$_{2-3}$)alkylene)$_n$-N(R$^b$)$_2$, —(O—(C$_{2-3}$)alkylene$_n$-N(R$^b$)$_2$, or a substituted or unsubstituted nitrogen-containing monocyclic $C_{2-7}$ heterocycloalkyl group or $C_{3-30}$ heteroaryl group;

each R$^b$ is independently hydrogen, a substituted or unsubstituted $C_{1-10}$ alkyl group, a substituted or unsubstituted polycyclic or monocyclic $C_{3-10}$ cycloalkyl group, or a substituted or unsubstituted polycyclic or monocyclic $C_{6-12}$ aryl group;

each R$^c$ is independently hydrogen, a halogen, a substituted or unsubstituted $C_{1-10}$ alkyl group, a substituted or unsubstituted $C_{2-10}$ alkenyl group, a substituted or unsubstituted $C_{2-10}$ alkynyl group, a substituted or unsubstituted $C_{1-10}$ alkoxy group, a substituted or unsubstituted $C_{3-10}$ cycloalkyl group, a substituted or unsubstituted $C_{3-10}$ cycloalkenyl group, a substituted or unsubstituted $C_{6-12}$ aryl group, a substituted or unsubstituted $C_{6-12}$ aryloxy group, a substituted or unsubstituted $C_{6-12}$ arylthio group, or a substituted or unsubstituted $C_{7-10}$ arylalkyl group; and each n is independently an integer from 1 to 5.

4. The method of claim 1, wherein the amine-containing polymer has a weight average molecular weight from 1,000 to 100,000 grams per mole, as determined by gel permeation chromatography.

5. The method of claim 1, wherein the coating composition further comprises a crosslinking agent.

6. The method of claim 1, wherein the coating composition further comprises a thermal acid generator or a thermal base generator.

7. A method for forming a photoresist relief image, the method comprising:

applying a layer of a coating composition on a substrate; and disposing a layer of a photoresist composition on the layer of the coating composition, wherein the coating composition comprises an amine-containing polymer comprising a hydrocarbon-substituted amino group and having nitrogen atoms in an amount from 3 to 47 weight percent, based on a total weight of the amine-containing polymer, wherein the amine-containing polymer comprises a repeating structural unit represented by at least one of Formulae (3) or (4):

(3)

(4)

wherein, in Formulae (3) and (4), $R^1$ and $R^2$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group;

$Q^2$ is a substituted or unsubstituted aliphatic group, a substituted or unsubstituted cycloaliphatic group, a substituted or unsubstituted aromatic group, a substituted or unsubstituted heteroaromatic group, and combinations thereof, optionally with one or more linking moiety chosen from —O—, —N(R$^b$)—, —COO—, —CONR$^b$—, —CONR$^b$—, and —OCONR$^b$—, and wherein $Q^2$ is optionally a branching group connected to at least two repeat units represented by Formula (3);

Ar is a substituted or unsubstituted $C_{6-18}$ arylene group or a substituted or unsubstituted $C_{3-18}$ heteroarylene group;

$X^3$ is a substituted or unsubstituted nitrogen-containing monocyclic, polycyclic, or fused polycyclic $C_{2-7}$ heterocycloalkyl group or $C_{3-30}$ heteroaryl group;

$R^a$ is hydrogen or a substituted or unsubstituted $C_{1-30}$ alkyl group; and each $R^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group.

8. The method of claim 7, wherein in Formulae (3) and (4), $R^1$ and $R^2$ are hydrogen;

$Q^2$ is a substituted or unsubstituted aliphatic group, a substituted or unsubstituted cycloaliphatic group, a substituted or unsubstituted aromatic group, a substituted or unsubstituted heteroaromatic group, and combinations thereof, optionally with one or more linking moiety chosen from —O—, —N($R^b$)—, —COO—, —CONR$^b$—, —CONR$^b$—, and —OCONR$^b$—;

Ar is a substituted or unsubstituted phenylene group;

$R^a$ is hydrogen; and each $R^b$ is independently hydrogen, a substituted or unsubstituted $C_{1-10}$ alkyl group, a substituted or unsubstituted polycyclic or monocyclic $C_{3-10}$ cycloalkyl group, or a substituted or unsubstituted polycyclic or monocyclic $C_{6-12}$ aryl group.

9. The method of claim 7, further comprising:
disposing an additional layer directly on the layer of the coating composition; and
disposing the layer of the photoresist composition directly on the additional layer,
wherein the additional layer comprises at least one of a hardmask layer, a silicon-containing layer, or organic layer.

10. The method of claim 7, wherein the amine-containing polymer has a weight average molecular weight from 1,000 to 100,000 grams per mole, as determined by gel permeation chromatography.

11. The method of claim 7, wherein the coating composition further comprises a crosslinking agent.

12. The method of claim 7, wherein the coating composition further comprises a thermal acid generator or a thermal base generator.

13. A coating composition for use with an overcoated photoresist composition, the coating composition comprising an amine-containing polymer comprising a hydrocarbon-substituted amino group and having nitrogen atoms in an amount from 3 to 47 weight percent, based on a total weight of the amine-containing polymer,
wherein the amine-containing polymer comprises a repeating structural unit represented by at least one of Formulae (1) or (2):

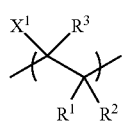
(1)

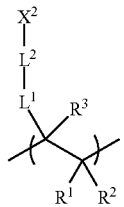

wherein, in Formulae (1) and (2), $R^1$ to $R^3$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group;

$L^1$ is a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —O—, —C(=O)O—, —O(C=O)—, —CONR$^b$—, or —OC(=O)NR$^b$—;

$L^2$ is a single bond, a substituted or unsubstituted $C_{1-30}$ alkylene group, a substituted or unsubstituted $C_{2-30}$ alkenylene group, a substituted or unsubstituted $C_{1-30}$ heteroalkene group, a substituted or unsubstituted $C_{3-7}$ heterocycloalkylene group, a substituted or unsubstituted $C_{6-30}$ arylene group, a substituted or unsubstituted $C_{3-30}$ heteroarylene group, —(C($R^c$)=N—($C_{2-3}$)alkylene)$_n$-, —(NR$^b$—($C_{2-3}$)alkylene)$_n$-, or —(O—($C_{2-3}$)alkylene)$_n$-;

$X^1$ is —N($R^b$)$_2$ or a substituted or unsubstituted nitrogen-containing monocyclic, polycyclic, or fused polycyclic $C_{2-7}$ heterocycloalkyl group or $C_{3-30}$ heteroaryl group;

$X^2$ is —C($R^c$)=NR$^b$, —N=C($R^c$)$_2$, —(NR$^b$—($C_{2-3}$)alkylene)$_n$-N($R^b$)$_2$, —(O—($C_{2-3}$)alkylene)$_n$-N($R^b$)$_2$, or a substituted or unsubstituted nitrogen-containing monocyclic, polycyclic, or fused polycyclic $C_{2-7}$ heterocycloalkyl group or $C_{3-30}$ heteroaryl group;

each $R^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group;

each $R^c$ is independently hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{1-30}$ alkoxy group, a substituted or unsubstituted $C_{3-30}$ cycloalkyl group, a substituted or unsubstituted $C_{3-30}$ cycloalkenyl group, a substituted or unsubstituted $C_{6-30}$ aryl group, a substituted or unsubstituted $C_{6-30}$ aryloxy group, a substituted or unsubstituted $C_{6-30}$ arylthio group, or a substituted or unsubstituted $C_{7-30}$ arylalkyl group; and each n is independently an integer from 1 to 20.

14. A coated substrate, comprising:
a layer of the coating composition of claim 13 disposed on a substrate; and
a layer of a photoresist composition disposed on the layer of the coating composition.

15. A coating composition for use with an overcoated photoresist composition, the coating composition comprising an amine-containing polymer comprising a hydrocarbon-substituted amino group and having nitrogen atoms in an amount from 3 to 47 weight percent, based on a total weight of the amine-containing polymer, wherein the amine-containing polymer comprises a repeating structural unit represented by at least one of Formulae (3) or (4):

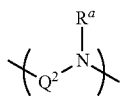
(3)

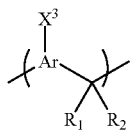
(4)

wherein, in Formulae (3) and (4), $R^1$ and $R^2$ are each independently hydrogen, a substituted or unsubstituted $C_{1-10}$ alkyl group, a substituted or unsubstituted $C_{3-10}$ cycloalkyl group, or a substituted or unsubstituted $C_{6-20}$ aryl group;

$Q^2$ is a substituted or unsubstituted aliphatic group, a substituted or unsubstituted cycloaliphatic group, a substituted or unsubstituted aromatic group, a substituted or unsubstituted heteroaromatic group, and combinations thereof, optionally with one or more linking moiety chosen from —O—, —N($R^b$)—, —COO—, —CONR$^b$—, —CONR$^b$—, and —OCONR$^b$—, and wherein $Q^2$ is optionally a branching group connected to at least two repeat units represented by Formula (3);

Ar is a substituted or unsubstituted $C_{6-18}$ arylene group or a substituted or unsubstituted $C_{3-18}$ heteroarylene group;

$X^3$ is —N($R^b$)$_2$ or a substituted or unsubstituted nitrogen-containing monocyclic, polycyclic, or fused polycyclic $C_{2-7}$ heterocycloalkyl group or $C_{3-30}$ heteroaryl group;

$R^a$ is hydrogen or a substituted or unsubstituted $C_{1-30}$ alkyl group; and each $R^b$ is independently hydrogen, a substituted or unsubstituted $C_{1-30}$ alkyl group, a substituted or unsubstituted polycyclic or monocyclic $C_{3-30}$ cycloalkyl group, or a substituted or unsubstituted polycyclic or monocyclic $C_{6-30}$ aryl group.

* * * * *